United States Patent [19]
Koifman et al.

[11] Patent Number: 5,638,020
[45] Date of Patent: Jun. 10, 1997

[54] SWITCHED CAPACITOR DIFFERENTIAL CIRCUITS

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 614,418

[22] Filed: Mar. 8, 1996

[30] Foreign Application Priority Data

Mar. 25, 1995 [GB] United Kingdom ............... 9506139

[51] Int. Cl.$^6$ ........................................... H03F 1/08
[52] U.S. Cl. ........................ 327/382; 327/90; 327/94; 327/554; 327/65; 327/337; 327/341; 330/9; 330/258; 330/51; 333/173
[58] Field of Search ............................ 327/90, 94, 96, 327/45, 341, 344, 382, 554, 561, 552, 336, 337, 65; 330/51, 258, 9; 333/173

[56] References Cited

U.S. PATENT DOCUMENTS 5,514,999  5/1996  Koifman et al. ..................... 330/9

*Primary Examiner*—Timothy P. Callahan
*Assistant Examiner*—Dinh T. Le
*Attorney, Agent, or Firm*—Rennie William Dover

[57] ABSTRACT

A switched capacitor differential circuit switches first and second differential input signals (Vinp1, Vinp2) to respective inputs (A, B) of an operational amplifier (12) via respective first and second signal paths. Each signal path includes a coupling capacitor (13, 14) and two switching devices (2, 3 and 4, 5) to switch the input signals to charge the capacitors at a first phase of a clock signal and to discharge the capacitors onto the inputs of the amplifier at a second phase of the clock signal. In order to remove common mode spikes from transferring to the amplifier, a pair of comon mode capacitors (16, 17) are coupled between the inputs and a common node (15), which is coupled via a pair of switches (6, 7) to the first and second signal paths between the capacitors and the second of the switching devices so that the coupling capacitors are discharged relative to the common node.

5 Claims, 2 Drawing Sheets

−PRIOR ART−

SWITCHED CAPACITOR DIFFERENTIAL CIRCUITS

FIELD OF THE INVENTION

This invention relates to switched capacitor differential circuits.

BACKGROUND OF THE INVENTION

Switched capacitor differential circuits are generally used to provide differential inputs to operational amplifiers, and can be connected in the form of a feedback circuit between the output of the amplifier and its inputs.

As best shown in FIG. 1, a known system includes a switched capacitor circuit 20 for switching differential inputs Vinp1 and Vinp2 into first and second inputs A and B of an operational amplifier 32. Switched capacitor circuit 20 receives two control inputs consisting of a first phase control clock signal PHI0 and a second phase control clock signal PHI1 that is non-overlapping with the first phase control clock signal PHI0.

The switched capacitor circuit 20 has a first input coupled to receive input signal Vinp1 and a second input coupled to receive input signal Vinp2 and a third input coupled to receive an analog ground signal AG. Analog ground AG is a voltage reference relative to which the input signals Vinp1 and Vinp2 change. The switched capacitor circuit 20 has a first output coupled to the first input A of the amplifier 32 and a second output coupled to the second input B of the amplifier 32.

Switched capacitor circuit 20 includes a first pair of switching transistors 22 and 23 which both have their gate electrodes connected to the first phase control clock signal PHI0, their respective source electrodes connected to the first and second inputs, respectively, and their respective drain electrodes connected to respective first electrodes of first and second respective capacitors 30 and 31.

A second pair of switching transistors 24 and 25 both have their gate electrodes connected to the second phase control clock signal PHI1, their respective source electrodes connected to the first and second outputs, respectively, and their respective drain electrodes connected to respective second electrodes of the first and second respective capacitors 30 and 31.

A third pair of switching transistors 28 and 29 have their gate electrodes coupled to the second phase control clock signal PHI1, their source electrodes coupled to the third input AG and their respective drain electrodes coupled to the respective first electrodes of the respective capacitors 30 and 31.

A fourth pair of switching transistors 26 and 27 have their gate electrodes coupled to the first phase control clock signal PHI0, their source electrodes coupled to the third input AG and their respective drain electrodes coupled to the respective second electrodes of the respective capacitors 30 and 31.

In operation, the switched capacitor circuit 20 charges capacitor 30 from the first input Vinp1, and capacitor 31 from the second input Vinp2, during an active period of the first phase control clock signal PHI0. During the active period of the second phase control clock signal PHI1, capacitor 30 is discharged to the analog ground AG and its charge transferred to the first output, and the charge on capacitor 31 is similarly transferred to the second output. However, since the voltage on the gate electrodes of transistors 22 and 23 is constant while that on their drain ansd source electrodes is changing according to the input signals, the source-drain ON resistance is also changing according to the oinput signal. Therefore, the RC constant for charging the capacitors also changes according to the input signal. This causes problems in mixed analod and digital circuits where the analog part is often operating in extremely noisy digital environments such that digital noise and spike voltage, which are of common mode nature, penetrate through to the analog part. Of course, since the RC constant depends on the input signals, which are not the same in the two differential input paths, the common mode spike voltage converts to a differential one, which is then sampled on the capacitors producing a noise component.

BRIEF SUMMARY OF THE INVENTION

The present invention therefore seeks to provide a switched capacitor differential circuit which overcomes, or at least reduces the above-mentioned problems of the prior art.

Accordingly, the invention provides a switched capacitor differential circuit comprising first and second differential inputs coupled to respective first and second differential outputs via respective first and second signal paths, each signal path including a coupling capacitor and a first switching device between the input and the coupling capacitor and a second switching device between the coupling capacitor and the output, the control electrodes of the first switching devices of both paths being coupled together to switch at a first phase of a clock signal and the control electrodes of the second switching devices of both paths being coupled together to switch at a second phase of the clock signal non-overlapping with the first phase, a first comon mode capacitor coupled between the first input and a common mode node and a second common mode capacitor coupled between the second input and the common mode node, the common mode node being coupled via a pair of switches to the first and second signal paths between the coupling capacitors and the second switching devices, the switches being arranged to conduct during the first phase of the clock signal and not conduct during the second phase of the clock signal.

In a preferred embodiment, the switches comprise a pair of transistors whose control electrodes are coupled to the control electrodes of the first switching devices. The circuit preferably further includes a switchable coupling path coupling the two signal paths between the coupling capacitors and the first switching devices, the coupling path being switched to conduct during the second phase of the clock signal and not to conduct during the first phase of the clock signal. Preferably, the coupling path is coupled to a ground reference potential. The coupling path is preferably switched by a pair of switching devices whose control electrodes are coupled to the control electrodes of the second switching transistors.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
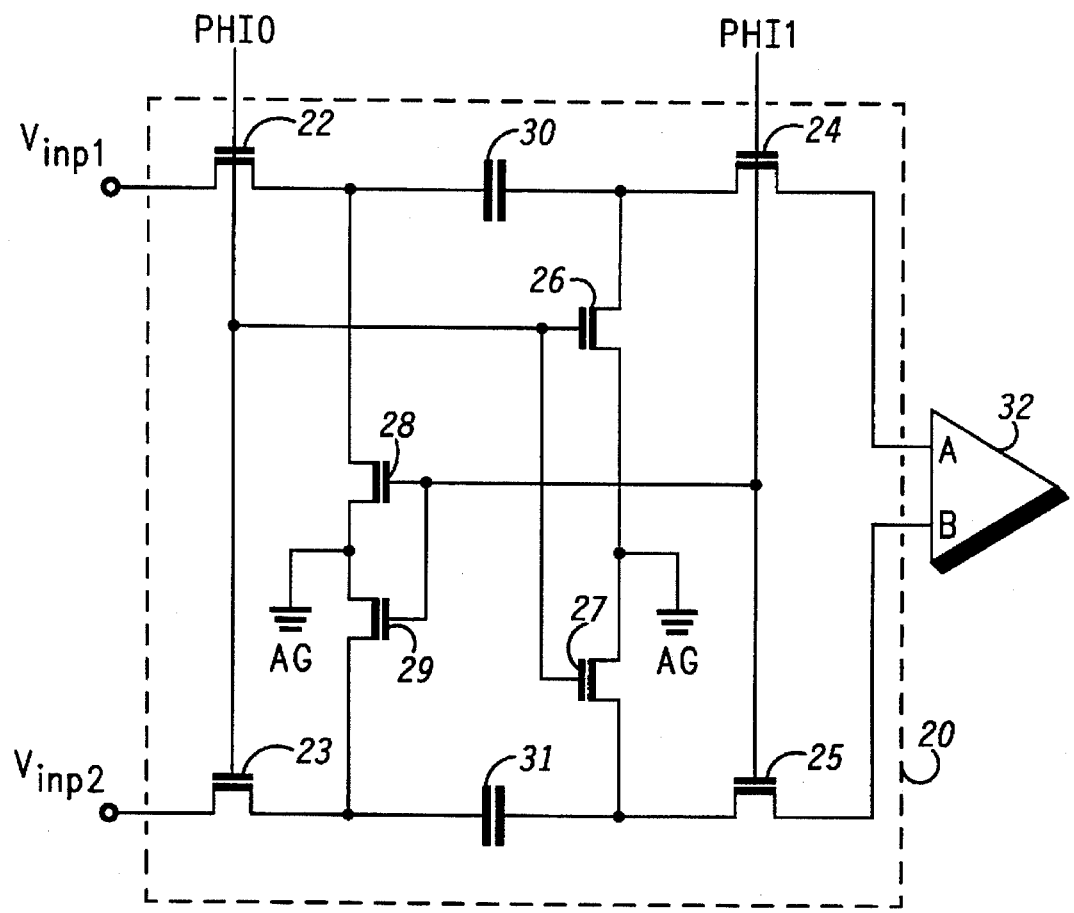
FIG. 1 is a schematic circuit diagram of a known prior art switched capacitor differential circuit coupled to an operational amplifier.
Figure 2:
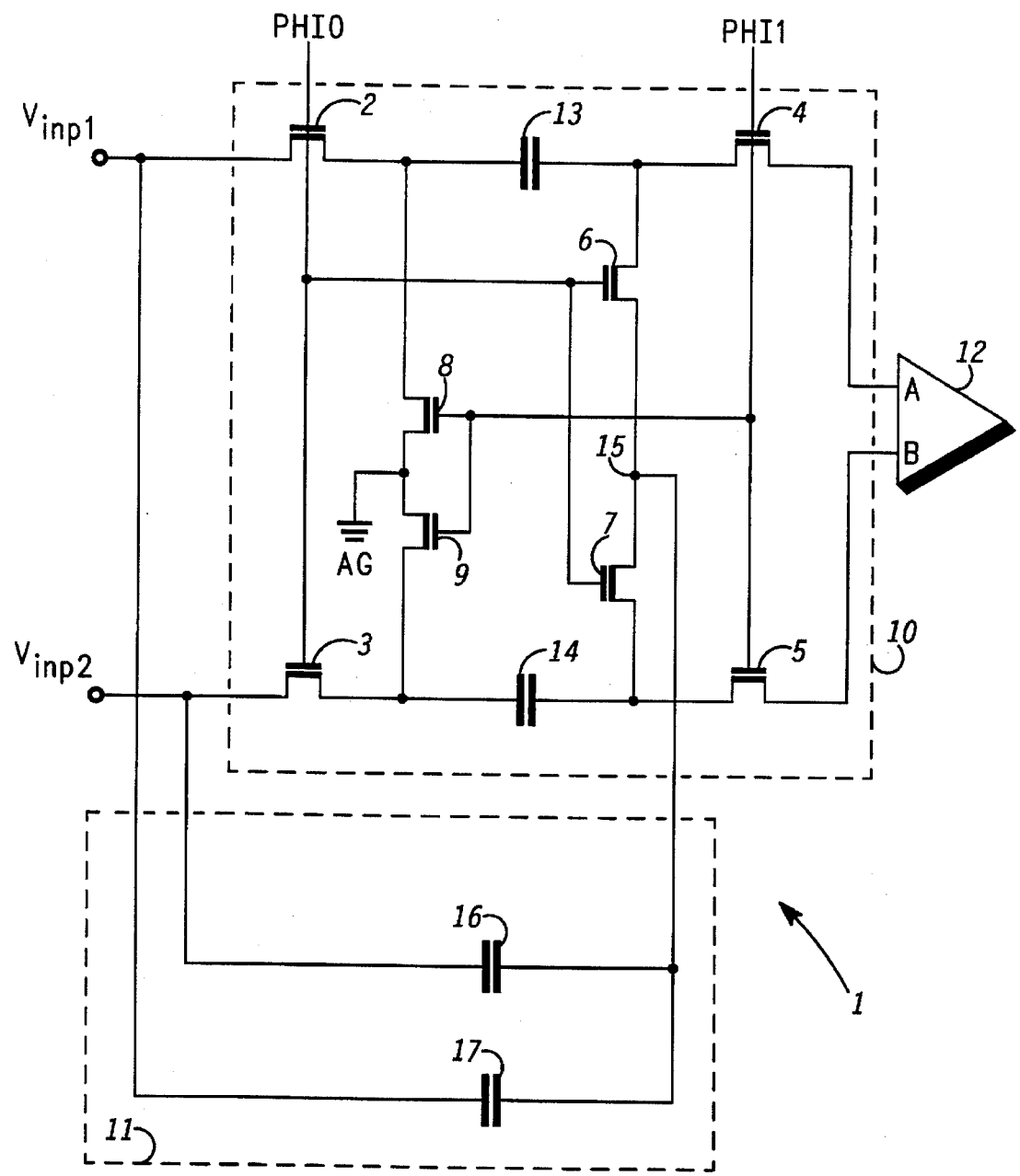
FIG. 2 is a schematic circuit diagram of a switched capacitor differential circuit, similar to that of FIG. 1, according to one embodiment of the invention.

Thus, as shown in FIG. 2, the switching capacitor differential circuit 1 comprises a switching circuit 10 and a common mode circuit 11. As in the known system, the switching circuit 10 switches differential input signals Vinp1 and Vinp2 into first and second inputs A and B of an operational amplifier 12. Switching circuit 10 receives two control inputs consisting of a first phase control clock signal PHI0 and a second phase control clock signal PHI1 that is non-overlapping with the first phase control clock signal PHI0.

The switching circuit 10 has a first input coupled to receive input signal Vinp1 and a second input coupled to receive input signal Vinp2 and a third input coupled to receive an analog ground signal AG. Analog ground AG is a voltage reference relative to which the input signals Vinp1 and Vinp2 change. The switching circuit 10 has a first output coupled to a first input A of an operational amplifier 12 and a second output coupled to a second input B of the amplifier 12.

Switching circuit 10 includes a first pair of switching transistors 2 and 3 which both have their gate electrodes connected to the first phase control clock signal PHI0, their respective source electrodes connected to the first and second inputs, respectively, and their respective drain electrodes connected to respective first electrodes of first and second respective capacitors 13 and 14.

A second pair of switching transistors 4 and 5 both have their gate electrodes connected to the second phase control clock signal PHI1, their respective source electrodes connected to the first and second outputs, respectively, and their respective drain electrodes connected to respective second electrodes of the first and second respective capacitors 13 and 14.

A third pair of switching transistors 8 and 9 have their gate electrodes coupled to the second phase control clock signal PHI1, their source electrodes coupled to the third input AG and their respective drain electrodes coupled to the respective first electrodes of the respective capacitors 13 and 14.

A fourth pair of switching transistors 6 and 7 have their gate electrodes coupled to the first phase control clock signal PHI0, their respective drain electrodes coupled to the respective second electrodes of the respective capacitors 13 and 14 and their source electrodes coupled to a node 15.

The common mode circuit 11 includes a pair of capacitors 16 and 17. A first input of the common mode circuit 11 is coupled to the first electrode of capacitor 16 so as to receive input signal Vinp1 and a second input of the common mode circuit 11 is coupled to the first electrode of capacitor 17 so as to receive input signal Vinp2. The second electrodes of the two capacitors 16 and 17 are coupled together to form the output of the common mode circuit 11, which output is coupled to the node 15. The common mode circuit 11 thus provides an AC average of its first and second inputs on its output.

In operation, therefore, during the active period of first phase control clock signal PHI0, the switching transistors 2 and 3 are switched on and capacitor 13 is charged from the first input Vinp1, and capacitor 14 from the second input Vinp2, relative to the voltage on node 15 due to switching transistors 6 and 7 being switched on during the same active period. During the active period of second phase control clock signal PHI0, capacitor 13 is discharged to the analog ground AG and its charge transferred to the first output relative to voltage AG, and the charge on capacitor 14 is similarly transferred to the second output.

However, assuming that the values of inputs A and B of the amplifier 12 are equal to voltage AG at the relevant timing at the end of each active period of first phase control clock signal PHI0 and second phase control clock signal PHI1, and that the capacitors 16 and 17 have a much larger value than the parasitic capacitance in the circuit such as the bottom plate capacitance on capacitors 13 and 14 and the gate capacitance of switching transistors 2 and 3, then, in the event of a common mode spike appearing at inputs Vinp1 and Vinp2, the same common mode spike will appear at node 15, the output of common mode circuit 11, and hence it will not affect the sampled value on capacitors 13 and 14 so that the circuit is immune to common mode spikes.

It will be appreciated that although only one particular embodiment of the invention has been described in detail, various modifications and improvements can be made by a person skilled in the art without departing from the scope of the present invention.

We claim:

1. A switched capacitor differential circuit comprising first and second differential inputs coupled to respective first and second differential outputs via respective first and second signal paths, each signal path including a coupling capacitor and a first switching device between the input and the coupling capacitor and a second switching device between the coupling capacitor and the output, the control electrodes of the first switching devices of both paths being coupled together to switch at a first phase of a clock signal and the control electrodes of the second switching devices of both paths being coupled together to switch at a second phase of the clock signal non-overlapping with the first phase, a first comon mode capacitor coupled between the first input and a common mode node and a second common mode capacitor coupled between the second input and the common mode node, the common mode node being coupled via a pair of switches to the first and second signal paths between the coupling capacitors and the second switching devices, the switches being switched to conduct during the first phase of the clock signal and not conduct during the second phase of the clock signal.

2. A switched capacitor differential circuit according to claim 1, wherein the switches comprise a pair of transistors whose control electrodes are coupled to the control electrodes of the first switching devices.

3. A switched capacitor differential circuit according to claim 1, further comprising a switchable coupling path coupling the two signal paths between the coupling capacitors and the first switching devices, the coupling path being switched to conduct during the second phase of the clock signal and not to conduct during the first phase of the clock signal.

4. A switched capacitor differential circuit according to claim 3, wherein the switchable coupling path is coupled to a ground reference potential.

5. A switched capacitor differential circuit according to claim 3, wherein the switchable coupling path is switched by a pair of transistors whose control electrodes are coupled to the control electrodes of the second switching devices.

* * * * *